US012672410B2

(12) United States Patent
Sato

(10) Patent No.: US 12,672,410 B2
(45) Date of Patent: Jun. 30, 2026

(54) LIGHT-EMITTING DEVICE AND MANUFACTURING METHOD OF LIGHT-EMITTING DEVICE

(71) Applicant: NICHIA CORPORATION, Anan (JP)

(72) Inventor: Daisuke Sato, Anan (JP)

(73) Assignee: NICHIA CORPORATION, Anan (JP)

( * ) Notice: Subject to any disclaimer, the term of this patent is extended or adjusted under 35 U.S.C. 154(b) by 378 days.

(21) Appl. No.: 18/350,619

(22) Filed: Jul. 11, 2023

(65) Prior Publication Data

US 2024/0021771 A1 Jan. 18, 2024

(30) Foreign Application Priority Data

Jul. 13, 2022 (JP) ................................. 2022-112125

(51) Int. Cl.
| | |
|---|---|
| *H10H 20/857* | (2025.01) |
| *H10H 20/01* | (2025.01) |
| *H10H 20/813* | (2025.01) |
| *H10H 20/85* | (2025.01) |
| *H10H 20/851* | (2025.01) |

(52) U.S. Cl.
CPC ........ *H10H 20/857* (2025.01); *H10H 20/813* (2025.01); *H10H 20/8506* (2025.01); *H10H 20/8512* (2025.01); *H10H 20/036* (2025.01)

(58) Field of Classification Search
CPC ............... H10H 20/857; H10H 20/813; H10H 20/8506; H10H 20/8512; H10H 20/036; H10H 20/01; H10H 20/0361; H10H 20/8515; H10H 20/855; H01S 5/02257;

H01S 5/06825; H01S 5/0087; H01S 5/02208; H01S 5/02345; H01S 5/32341; H01L 25/167; H10W 90/00
See application file for complete search history.

(56) References Cited

U.S. PATENT DOCUMENTS

| | | |
|---|---|---|
| 2013/0001627 A1 | 1/2013 | Kinoshita et al. |
| 2013/0320380 A1* | 12/2013 | Kanemaru ......... H10H 20/8515 438/27 |
| 2016/0020368 A1 | 1/2016 | Kanamaru |

(Continued)

FOREIGN PATENT DOCUMENTS

| | | |
|---|---|---|
| JP | 2010-045248 A | 2/2010 |
| JP | 2011-243951 A | 12/2011 |

(Continued)

*Primary Examiner* — Jonathan Han
(74) *Attorney, Agent, or Firm* — Spencer Fane LLP

(57) ABSTRACT

A light-emitting device includes a base member, a frame member and a light-emitting element. The frame member is fixed to the base member and has one or more inner lateral surfaces and one or more outer lateral surfaces. The frame member includes a first part containing a wavelength conversion material and defining one part of the one or more inner lateral surfaces and one part of the one or more outer lateral surfaces, and a second part connected with the first part and defining another part of the one or more inner lateral surfaces and another part of the one or more outer lateral surfaces. The light emitting element has a light-emitting surface, and is configured to emit, from the light-emitting surface, light to be incident on the one part of the one or more inner lateral surfaces defined by the first part of the frame member.

9 Claims, 11 Drawing Sheets

(56)                  References Cited

U.S. PATENT DOCUMENTS

| | | | | |
|---|---|---|---|---|
| 2016/0268770 A1* | 9/2016 | Tazawa | ............... | H01S 5/02335 |
| 2016/0313498 A1* | 10/2016 | Oh | ..................... | H10H 20/8506 |
| 2018/0172899 A1 | 6/2018 | Oh et al. | | |
| 2024/0372315 A1* | 11/2024 | Takiguchi | ............... | H01S 5/023 |

FOREIGN PATENT DOCUMENTS

| | | | |
|---|---|---|---|
| JP | 2013-115280 A | 6/2013 |
| JP | 2013-143430 A | 7/2013 |
| JP | 2013-197335 A | 9/2013 |
| JP | 2013-251393 A | 12/2013 |
| JP | 2016-167492 A | 9/2016 |
| JP | 2016-208037 A | 12/2016 |
| JP | 2018-060989 A | 4/2018 |
| JP | 2019-67842 A | 4/2019 |
| JP | 2022-002269 A | 1/2022 |

* cited by examiner 92B, 92B1

92B, 92B1

92B, 92B2

92B, 92B1

92B, 92B1

92B, 92B2

92B, 92B1

92B, 92B1

92B, 92B2

92B3

92B, 92B1

92B, 92B1

LIGHT-EMITTING DEVICE AND MANUFACTURING METHOD OF LIGHT-EMITTING DEVICE

CROSS-REFERENCE TO RELATED APPLICATIONS

This application claims priority to Japanese Patent Application No. 2022-112125, filed on Jul. 13, 2022, the disclosure of which is hereby incorporated herein by reference in its entirety.

BACKGROUND

The present invention relates to a light-emitting device and a manufacturing method of a light-emitting device.

Japanese Patent Publication No. JP2019-67842 discloses a light source device that includes a base member, a light-transmissive member surrounding a semiconductor laser element disposed on the base member, and a wavelength conversion member disposed lateral to the semiconductor laser element and extracts light from a lateral surface thereof. The light-transmissive member includes one through hole in which the semiconductor laser element is disposed, and the other through hole in which the wavelength conversion member is disposed separately from the one through hole.

SUMMARY

Because the light-transmissive member is present between the semiconductor laser element and the wavelength conversion member, a size of the light source device in the Japanese Patent Publication No. JP2019-67842 is increased accordingly.

A light-emitting device disclosed in an embodiment includes a base member, a frame member and a light-emitting element. The base member has a mounting surface. The frame member is fixed to the base member and has one or more inner lateral surfaces and one or more outer lateral surfaces. The frame member includes a first part containing a wavelength conversion material and defining one part of the one or more inner lateral surfaces and one part of the one or more outer lateral surfaces, and a second part connected with the first part and defining another part of the one or more inner lateral surfaces and another part of the one or more outer lateral surfaces. The light-emitting element is disposed on the mounting surface. The light emitting element has a light-emitting surface, and is configured to emit, from the light-emitting surface, light to be incident on the one part of the one or more inner lateral surfaces defined by the first part of the frame member.

A method of manufacturing a light-emitting device disclosed in an embodiment includes: providing a first base having a mounting surface; disposing a plurality of light-emitting elements on the mounting surface; providing a second base containing a wavelength conversion material and defining a plurality of through holes penetrating from an upper surface of the second base to a lower surface of the second base; bonding the second base to the first base in a state of each of the light-emitting elements being accommodated in a corresponding one of the through holes in a top view; and singulating the second base and the first base into a plurality of light-emitting devices by cutting the second base and the first base together.

In at least one of one or more inventions disclosed in embodiments, an effect of reducing a size of a light-emitting device is expected.

DETAILED DESCRIPTION

Figure 1:
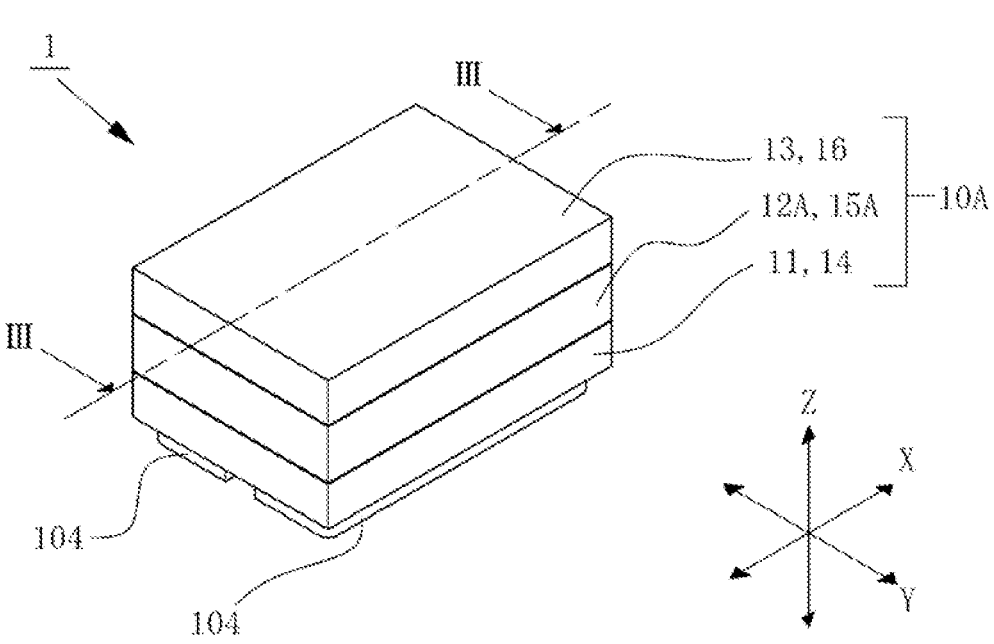
FIG. 1 is a perspective view of a light-emitting device according to a first embodiment.

In this description or the scope of the claims, polygons such as triangles and quadrangles, including shapes in which the corners of the polygon are rounded, chamfered, beveled, or coved, are referred to as polygons. Furthermore, a shape obtained by processing not only the corners (ends of sides), but also an intermediate portion of a side is similarly referred to as a polygon. That is, a shape that is partially processed while remaining a polygon shape as a base is included in the interpretation of "polygon" described in this description and the scope of the claims.

The same applies not only to polygons but also to words representing specific shapes such as trapezoids, circles, protrusions, and recessions. Furthermore, the same applies when dealing with each side forming that shape. That is, even if processing is performed on a corner or an intermediate portion of a certain side, the interpretation of "side" includes the processed portion. When a "polygon" or "side" not partially processed is to be distinguished from a processed shape, "exact" will be added to the description as in, for example, "exact quadrangle".

Furthermore, in this description or the claims, descriptions such as upper and lower, left and right, top and bottom, front and back, near and far, and the like are used merely to describe the relative relationship of positions, orientations, directions, and the like, and the expressions may not necessarily match an actual relationship at the time of use.

In the drawings, directions such as an X direction, a Y direction, and a Z direction may be indicated by using arrows. The directions of the arrows are the same across multiple drawings of the same embodiment.

Further, "member" and "portion" may be described when, for example, a component and the like are described in this description. The term "member" refers to an object physically treated alone. The object physically treated alone can be an object treated as one part in a manufacturing step. On the other hand, the term "portion" refers to an object that may not be physically treated alone. For example, the term "portion" is used when a part of one member is partially regarded.

The distinction between "member" and "portion" described above does not indicate an intention to consciously limit the scope of rights in interpretation of the doctrine of equivalents. In other words, even when there is a component described as "member" in the claims, this does not mean that the applicant recognizes that physically treating the component alone is essential in the application of the present invention.

Furthermore, in this description or the claims, when there are a plurality of components and each of these components is to be indicated separately, the components may be distinguished by adding the terms "first" and "second" at the beginning of the name of the component. Furthermore, objects to be distinguished can differ between this description and the claims. Thus, even when a component in the claims is given the same term as that in this description, the object indicated by that component can be inconsistent between this description and the claims.

For example, when there are components distinguished by being termed "first", "second", and "third" in this description, and when components given the terms "first" and "third" in this description are described in the claims, these components may be distinguished by being denoted as "first" and "second" in the claims for ease of understanding. In this case, the components denoted as "first" and "second" in the claims refer to the components termed "first" and "third" in this description, respectively. This rule is not limited to components and also applies to other objects in a reasonable and flexible manner.

Embodiments for implementing the present invention will be described below. Furthermore, specific embodiments for implementing the present invention will be described below with reference to the drawings. Embodiments for implementing the present invention are not limited to the specific embodiments. In other words, the embodiments illustrated by the drawings are not an only form in which the present invention is realized. Sizes, positional relationships, and the like of members illustrated in the drawings may sometimes be exaggerated in order to facilitate understanding.

First Embodiment

Figure 2:
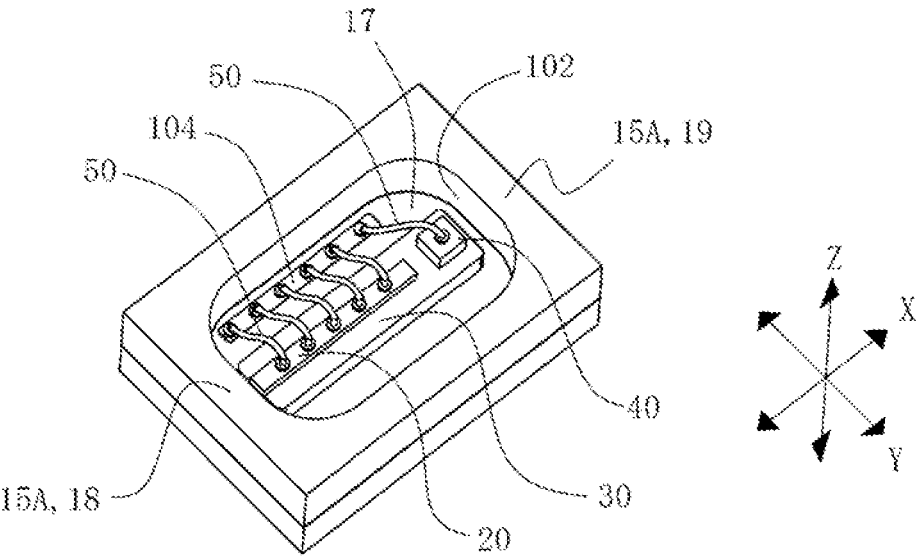
FIG. 2 is a perspective view of a state in which a cover member is removed from the light-emitting device for illustrating an internal configuration of a package of the light-emitting device according to the first embodiment.
Figure 3:
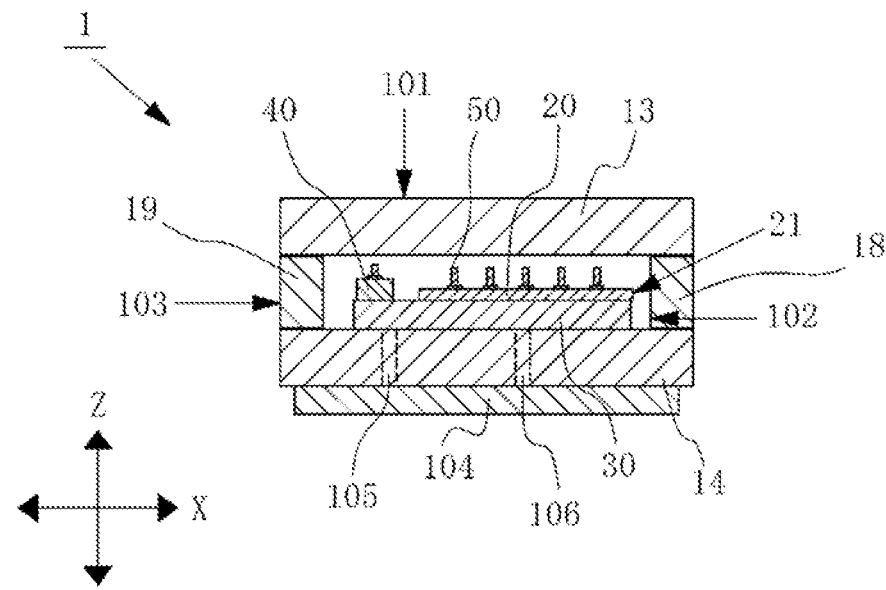
FIG. 3 is a cross-sectional view taken along a section line in FIG. 1.
Figure 4:
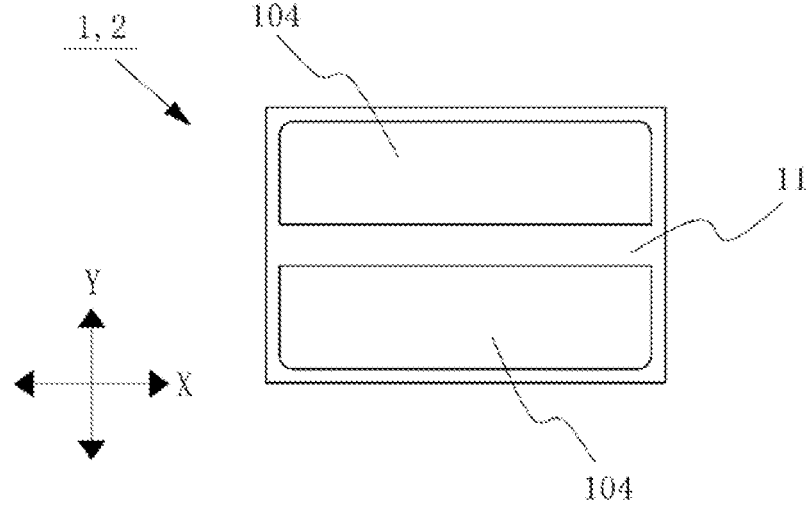
FIG. 4 is a bottom view of the light-emitting device according to each embodiment.

A light-emitting device 1 according to a first embodiment will now be described. FIGS. 1 to 4 and 5A to 5H are views for illustrating an exemplary embodiment of the light-emitting device 1. FIG. 1 is a schematic perspective view of the light-emitting device 1. FIG. 2 is a perspective view of the light-emitting device 1 from which a cover member 13 is removed for illustrating an internal configuration of a package 10A. FIG. 3 is a cross-sectional view taken along a section line in FIG. 1. In the cross-sectional view of FIG. 3, positions of a first via wiring line 105 and a second via wiring line 106 that do not appear on the cross-section are illustrated by broken lines. FIG. 4 is a bottom view of the light-emitting device 1. The drawings from FIGS. 5A to 5H are diagrams for illustrating a manufacturing method of the light-emitting device 1.

The light-emitting device 1 includes a plurality of components. The plurality of components include a package 10A, one or more light-emitting elements 20, one or more submounts 30, one or more protective elements 40, and a plurality of wiring lines 50. Furthermore, the package 10A includes a plurality of components including a base member 11, a frame member 12A, and a cover member 13.

The light-emitting device 1 may include a component other than the components described above. For example, the light-emitting device 1 may further include a light-emitting element different from the plurality of light-emitting elements 20. The light-emitting device 1 may not include some of the components described above.

First, each of the components will be described.

Package 10A

The package 10A includes a base portion 14, a frame portion 15A, and a cover portion 16. The base portion 14 has a mounting surface 17 on which other components are mounted. The frame portion 15A surrounds the mounting surface 17 in a plan view (hereinafter, referred to as a first plan view) as seen along a normal direction perpendicular to the mounting surface 17. An upper end of the frame portion 15A is located above the mounting surface 17. The cover portion 16 has a first surface facing the mounting surface 17 and a second surface located opposite the first surface. The second surface is an upper surface 101 of the package 10A.

The frame portion 15A has one or more inner lateral surfaces 102 and one or more outer lateral surfaces 103. The frame portion 15A is present between a plane including the mounting surface 17 and a plane including the first surface. In the first plan view, the mounting surface 17 is surrounded by the one or more inner lateral surfaces 102 of the frame portion 15A. In the first plan view, the one or more inner lateral surfaces 102 of the frame portion 15A are surrounded by the one or more outer lateral surfaces 103 of the frame portion 15A.

The frame portion 15A includes a first part 18 containing a wavelength conversion material and a second part 19 different from the first part 18. The second part 19 can contain a wavelength conversion material. The second part 19 can contain the same wavelength conversion material as the wavelength conversion material contained in the first part 18. The mounting surface 17 is surrounded by a combined region of the first part 18 and the second part 19 in the first plan view.

In the frame portion 15A illustrated by the drawings, the first part 18 and the second part 19 contain the same wavelength conversion material. The first part 18 and the second part 19 are parts of the frame member 12A, which are integrally formed by using the same material. That is, the boundary between the first part 18 and the second part 19 cannot be seen from the outside.

The first part 18 includes one part of the one or more inner lateral surfaces 102 and one part of the one or more outer lateral surfaces 103 of the frame portion 15A. The second part 19 includes the other part of the one or more inner lateral surfaces 102 and the other part of the one or more outer lateral surfaces 103 of the frame portion 15A. The second part 19 is connected with the first part 18. A volume of the second part 19 is larger than a volume of the first part 18.

In the first plan view, a length of the one part of the one or more inner lateral surfaces 102 of the frame portion 15A included in the first part 18 is equal to or less than one-fourth of a length of the entire circumferences of the one or more inner lateral surfaces 102 surrounding the mounting surface 17. In the first plan view, one-fourth or less of the entire length of the frame defined by the one or more inner lateral surfaces 102 can be said to be the length of the inner lateral surface 102 included in the first part 18.

An inner edge shape of the frame portion 15A in the first plan view is a rectangle. In the first plan view, the shape of the frame defined by the one or more inner lateral surfaces 102 is a rectangle. That is, the frame portion 15A can be formed by the four inner lateral surfaces 102. The rectangle can have long sides and short sides. An outer edge shape of the frame portion 15A in the first plan view is a rectangle. That is, the frame portion 15A can be formed by the four outer lateral surfaces 103. The rectangle can have long sides and short sides. The first part 18 includes the inner lateral surface 102 and the outer lateral surface 103 each having one short side of the two short sides of the rectangle. The second part 19 includes the inner lateral surface 102 and the outer lateral surface 103 having the other short side of the two short sides of the rectangle.

In the frame portion 15A illustrated by the drawings, a long side direction of a rectangle of the inner edge shape and the outer edge shape is the same direction as the X direction, and a short side direction of the rectangle is the same direction as the Y direction. In addition, corners of the rectangle formed by the plurality of inner lateral surfaces 102 of the frame portion 15A are more rounded than corners of the rectangle formed by the plurality of outer lateral surfaces 103 of the frame portion 15A. More specifically, the corners of the rectangle formed by the outer lateral surface 103 are not rounded, and the corners of the rectangle formed by the inner lateral surface 102 are rounded. In the top view, the inner edge shape and the outer edge shape of the frame portion 15A may not be a rectangle.

A wiring pattern 104 is provided on the mounting surface 17 of the base portion 14. The wiring pattern 104 is connected to the first via wiring line 105 passing through the inside of the base portion 14 and is electrically connected to another wiring pattern 104 provided on the surface of the base portion 14. In the base portion 14 illustrated by the drawings, the wiring pattern 104 is electrically connected to a wiring pattern 104 provided on the lower surface of the base portion 14.

Two wiring patterns 104 are provided on the lower surface of the base portion 14. One of the two wiring patterns 104 is electrically connected to the first via wiring line 105, and the other of the two wiring patterns 104 is connected to the second via wiring line 106. Both the first via wiring line 105 and the second via wiring line 106 are provided in a through hole that penetrates from the upper surface to the lower surface of the base portion 14.

The base portion 14 can be formed by the base member 11. The frame portion can be formed by the frame member 12A. The cover portion 16 can be formed by the cover member 13. For example, the package 10A can be formed by sandwiching the frame member 12A between the base member 11 having a planar shape (a plate shape) and the cover member 13 having a planar shape (a plate shape), bonding the base member 11 and the frame member 12A, and bonding the cover member 13 and the frame member 12A. The internal space of the package 10A formed by the base member 11, the frame member 12A, and the cover member 13 can be a sealed space sealed under vacuum or a predetermined atmosphere.

The base member 11 can be formed by using ceramic as a main material. Examples of the ceramic include aluminum nitride, silicon nitride, aluminum oxide, and silicon carbide. In addition, it is preferable to form the base member 11 by using aluminum nitride having good heat dissipation properties.

A material other than ceramic may be used as a main material of the base member 11. For example, the base member 11 may be formed by using a metal or a composite containing a metal as a main material. Examples of the metal include copper, aluminum, iron, copper molybdenum, and copper tungsten. Alternatively, the metal-containing composite includes a copper-diamond composite material.

Here, the main material refers to a material that occupies the greatest ratio of a target formed product in terms of weight or volume. When a target formed product is formed of one material, that material is the main material. In other words, when a certain material is the main material, the percentage of that material can be 100%.

The frame member 12A can be formed by using ceramic as a main material. Examples of the ceramic include aluminum nitride, silicon nitride, aluminum oxide, and silicon carbide. In addition, it is preferable to form the frame member 12A by using aluminum nitride having good heat dissipation properties.

A material other than ceramic may be used for the frame member 12A. For example, the frame member 12A may be formed by using glass. A material other than ceramic may be used as a main material of the frame member 12A. For example, the frame member 12A may be formed by using glass as a main material. Examples of the glass include quartz glass and the like.

Examples of the wavelength conversion material contained in the frame member 12A include a phosphor. Examples of the phosphor include cerium-activated yttrium aluminum garnet (YAG), cerium-activated lutetium aluminum garnet (LAG), europium-activated silicate ((Sr, Ba)$_2$SiO$_4$), $\alpha$-SiAlON phosphor, and $\beta$-SiAlON phosphor. Among them, garnet-based phosphors such as YAG phosphor and LAG phosphor have good heat resistance.

The cover member 13 can be formed by using ceramic as a main material. Examples of the ceramic include aluminum nitride, silicon nitride, aluminum oxide, and silicon carbide. In addition, it is preferable to form the cover member 13 by using aluminum nitride having good heat dissipation properties.

A material other than ceramic may be used as a main material of the cover member 13. For example, the cover member 13 may be formed by using a metal, a composite containing a metal, or glass as a main material. Examples of the metal include copper, aluminum, iron, copper molybdenum, and copper tungsten, and examples of the composite containing the metal include a copper-diamond composite material. Alternatively, the glass may be, for example, quartz glass.

The base member 11 and the frame member 12A can be formed by using the same main material. The base member 11 and the cover member 13 can be formed by using the same material. The frame member 12A and the cover member 13 can be formed by using the same material. For example, the base member 11, the frame member 12A, and the cover member 13 can be made of ceramic.

Light-Emitting Element 20

The light-emitting element 20 has a light-emitting surface 21 from which light is emitted. The light-emitting element 20 includes an upper surface, a lower surface, and a plurality of lateral surfaces. A lateral surface of the light-emitting element 20 serves as a light-emitting surface 21. The light-emitting element 20 has one or more light-emitting surfaces 21.

A shape of the upper surface of the light-emitting element 20 is a rectangular shape having long sides and short sides. The shape of the upper surface of the light-emitting element 20 may not be a rectangle. A semiconductor laser element can be employed for the light-emitting element 20. The light-emitting element 20 is not limited to a semiconductor laser element, and a light-emitting diode or the like may be employed.

As the light-emitting element 20, for example, a light-emitting element that emits blue light, a light-emitting element that emits green light, or a light-emitting element that emits red light can be employed. A light-emitting element that emits light of another color may be employed as the light-emitting element 20.

Blue light refers to light having a light emission peak wavelength within a range from 420 nm to 494 nm. Green light refers to light having a light emission peak wavelength within a range from 495 nm to 570 nm. Red light refers to light having a light emission peak wavelength within a range from 605 nm to 750 nm.

Here, a semiconductor laser element being an example of the light-emitting element 20 will be described. The semiconductor laser element has a rectangular external shape having one opposite side as long sides and the other opposite side as short sides in a top view. Light (laser beam) emitted from the semiconductor laser element spreads. Furthermore, divergent light is emitted from an emission end surface of the semiconductor laser element. The emission end surface of the semiconductor laser element can be referred to as the light-emitting surface 21 of the light-emitting element 20.

The light emitted from the semiconductor laser element forms a far field pattern (hereinafter referred to as an "FFP") of an elliptical shape in a plane parallel to the emission end surface of the light. The FFP indicates a shape and a light intensity distribution of the emitted light at a position spaced apart from the emission end surface.

Here, light passing through the center of the elliptical shape of the FFP, in other words, light having a peak intensity in the light intensity distribution of the FFP is referred to as light traveling along an optical axis or light passing along an optical axis. Based on the light intensity distribution of the FFP, light having an intensity of $1/e^2$ or more with respect to a peak intensity value is referred to as a main part of the light.

The shape of the FFP of the light emitted from the semiconductor laser element is an elliptical shape in which the light in a layering direction is longer than in a direction perpendicular to the layering direction in the plane parallel to the emission end surface of the light. The layering direction is a direction in which a plurality of semiconductor layers including an active layer are layered in the semiconductor laser element. The direction perpendicular to the layering direction can also be referred to as a plane direction of the semiconductor layer. Furthermore, a long diameter direction of the elliptical shape of the FFP can also be referred to as a fast axis direction of the semiconductor laser element, and a short diameter direction can also be referred to as a slow axis direction of the semiconductor laser element.

Based on the light intensity distribution of the FFP, an angle at which light having a light intensity of $1/e^2$ of a peak light intensity spreads is referred to as a divergence angle of light of the semiconductor laser element. For example, the divergence angle of light may also be determined based on the light intensity that is half of the peak light intensity in addition to being determined based on the light intensity of $1/e^2$ of the peak light intensity. In this description herein, the term "divergence angle of light" simply refers to a divergence angle of light at the light intensity of $1/e^2$ of the peak light intensity. It can be said that a divergence angle in the fast axis direction is greater than a divergence angle in the slow axis direction.

Examples of the semiconductor laser element that emits blue light or the semiconductor laser element that emits green light include a semiconductor laser element including a nitride semiconductor. GaN, InGaN, and AlGaN, for example, can be used as the nitride semiconductor. Examples of the semiconductor laser element that emits red light include a semiconductor laser element including an InAlGaP-based, GaInP-based, GaAs-based, or AlGaAs-based semiconductor.

Submount 30

The submount 30 is formed in a rectangular parallelepiped shape. The upper surface of the submount 30 has a rectangular shape. The upper surface of the submount can have a rectangular shape with short sides and long sides. The shape of the submount 30 may not limited to the rectangular parallelepiped shape.

The submount 30 can be formed by using, for example, a metal as a main material or a composite containing a metal. The submount 30 is formed of a conductive material from the upper surface to the lower surface. Examples of the metal include copper, aluminum, iron, copper molybdenum, and copper tungsten. Furthermore, for example, the submount 30 may be formed by using a copper sheet.

The submount 30 can be formed to have a thickness in a range from 200 µm to 1000 µm. Within this thickness range, it is easy to form the submount 30 by using a copper sheet.

Protective Element 40

The protective element 40 suppresses specific elements (the light-emitting element 20, for example) from being damaged by the excessive current flowing through the specific elements. The protective element 40 is a Zener diode, for example. Furthermore, a Zener diode formed of Si can be used as the Zener diode.

Wiring Line 50

The wiring line 50 is a linear conductive material having both ends as bonding portions. The bonding portions at both ends are bonding parts with other components. The wiring line 50 is, for example, a metal wire. For example, gold, aluminum, silver, copper, or the like can be used as the metal.

Light-Emitting Device 1

Subsequently, a manufacturing method of the light-emitting device 1 including the above-described components will be described.

The light-emitting device 1 can be manufactured by a manufacturing method including providing a first base 91 having a mounting surface (hereinafter referred to as a first step), disposing the one or more light-emitting elements 20 on the mounting surface (hereinafter referred to as a second step), providing a second base 92A containing a wavelength conversion material (hereinafter referred to as a third step), and bonding the second base 92A to the first base 91 (hereinafter referred to as a fourth step).

In addition, the manufacturing method of the light-emitting device 1 may include disposing the one or more submounts 30 on the mounting surface (hereinafter, referred to as a fifth step). The manufacturing method of the light-emitting device 1 may include disposing the one or more protective elements 40 on the mounting surface (hereinafter, referred to as a sixth step). The manufacturing method of the light-emitting device 1 may include forming, in the second base 92A, one or more through holes penetrating from the upper surface to the lower surface of the second base 92A (hereinafter referred to as a seventh step). The manufacturing method of the light-emitting device 1 may include bonding a third base 93 to the second base 92A (hereinafter, referred to as an eighth step). The manufacturing method of the light-emitting device 1 may include cutting the second base 92A and the first base 91 bonded to the second base 92A to form the outer shape of the light-emitting device 1 (hereinafter referred to as a ninth step). The forming the outer shape of the light-emitting device 1 can be singulating into the plurality of light-emitting devices 1.

Hereinafter, each of the first to ninth steps will be described. The manufacturing method of the light-emitting device 1 does not necessarily use the first to ninth steps, but for convenience of description, the manufacturing steps including the first to ninth steps will be described in an order (first step→fifth step→second step→sixth step→third step including seventh step→fourth step→eighth step→ninth step). The order of the manufacturing steps may be appropriately changed.

In the first step, the first base 91 having the mounting surface is provided. The first base 91 has a planar shape (a plate shape). The shape is not limited to the planar shape. The first base 91 includes a part to be the base portion 14 of the light-emitting device 1. The mounting surface of the first base 91 includes the mounting surface 17 of the light-emitting device 1. The first base 91 corresponds to the base member 11 of the light-emitting device 1. The first base 91 can be formed of the material constituting the base member 11 described above.

The one or more wiring patterns 104 are provided on the mounting surface of the first base 91. The shape of the wiring pattern 104 in a plan view (hereinafter, referred to as a second plan view) as seen along a normal direction perpendicular to the mounting surface of the first base 91 is a rectangle having short sides and long sides. In the second plan view, the wiring pattern 104 has an elongated shape. In the wiring pattern 104, a length of the long side can be five times or more of a length of the short side.

Two or more wiring patterns 104 are provided on the lower surface of the first base 91. The lower surface of the first base 91 is a surface opposite to the mounting surface of the first base 91. On the mounting surface of the first base 91, one or more bonding patterns 94 are provided on a region to which the second base 92A is bonded. The bonding pattern 94 surrounds the wiring pattern 104.

The bonding pattern 94 forms a rectangular region surrounding the wiring pattern 104 in the second plan view. Hereinafter, the rectangular region is referred to as a mounting region. The mounting region is a region to be the mounting surface 17 of the light-emitting device 1. The mounting region is a rectangular region having long sides and short sides.

The long side direction of the mounting region is parallel to the long side direction of the wiring pattern 104. Here, the "parallel" includes a difference of ±10 degrees. The wiring pattern 104 is provided in the vicinity of the long side of the mounting region. The length of the long side of the wiring pattern 104 can be 50% or more of the length of the long side of the mounting region. The length of the long side of the wiring pattern 104 is smaller than the length of the long side of the mounting region.

The plurality of wiring patterns 104 having the same shape can be provided on the mounting surface of the first base 91. Each of the plurality of wiring patterns 104 is provided with the bonding pattern 94 surrounding the wiring pattern 104. Each of the wiring patterns 104 is provided such that the relative position thereof with respect to the mounting region is aligned.

Figure 5A:
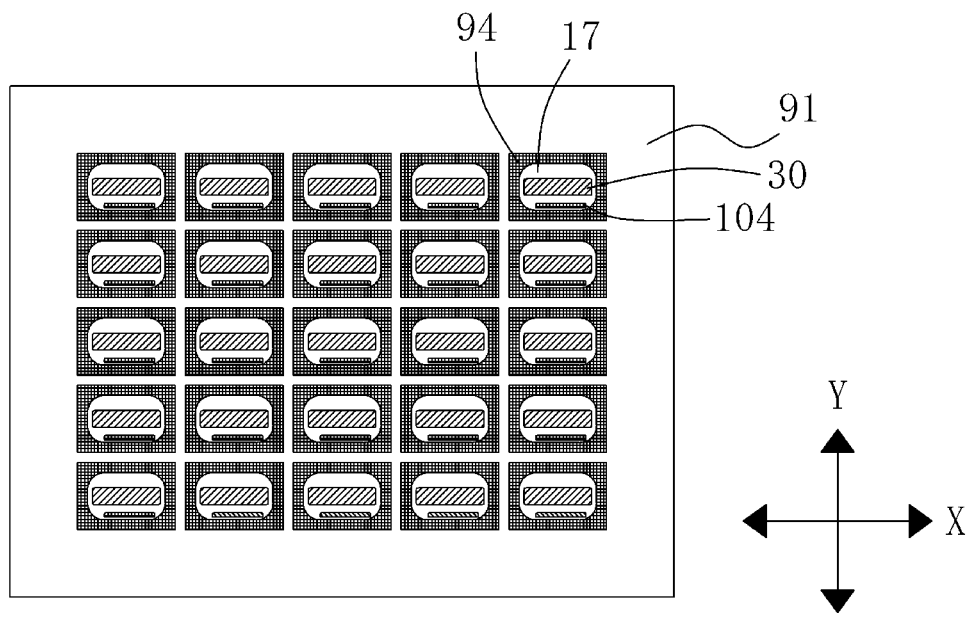
FIG. 5A is a view for illustrating one step in the manufacturing method of the light-emitting device according to each embodiment.

In the subsequent fifth step, the one or more submounts 30 are disposed on the mounting surface of the first base 91. FIG. 5A illustrates a state in which the fifth step has been completed. The submount 30 is electrically connected to the second via wiring line 106. In the second plan view, the second via wiring line 106 is included in the submount 30. A metal sheet is attached to the first base 91, and this sheet can be used as the submount 30. The thickness of the metal sheet is in a range from 200 μm to 1000 μm. A metal sheet formed of copper can be used.

The submount 30 is disposed in each mounting region of the first base 91. The long side direction of the mounting region is parallel to the long side direction of the upper surface of the submount 30. Here, the "parallel" includes a difference of ±10 degrees. A virtual line (hereinafter, referred to as a first virtual line) passing through the midpoint of the short side of the mounting region and parallel to the long side direction of the mounting region passes through the submount 30. In the second plan view, the wiring pattern 104 is located between the long side of the submount 30 and the long side of the mounting region that face each other.

The length of the long side of the submount 30 is greater than the length of the long side of the wiring pattern 104.

The corners of the rectangular mounting region are rounded. The long side of the submount 30 and the long side of the mounting region are in such a relationship that a part of the submount 30 overlaps the bonding pattern 94 when the submount 30 is disposed in the mounting region with the long side of the submount 30 being overlapped with the long side of the mounting region. The above-described relationship among the arrangement and shape of the submount 30, the wiring pattern 104, and the bonding pattern 94 can contribute to the reduction in size of the light-emitting device 1.

In the subsequent second step, the one or more light-emitting elements 20 are disposed on the mounting surface of the first base 91. The one or more light-emitting elements 20 are bonded to the submount 30. The light-emitting elements 20 are disposed on the mounting surface of the first base 91 via the submount 30. One light-emitting element 20 is disposed in one mounting region. The plurality of light-emitting elements 20 may be disposed in one mounting region.

In the second plan view, the light-emitting surface 21 of the light-emitting element 20 faces the short side of the mounting region. The light-emitting element 20 is disposed at a position through which the first virtual line passes. In the second plan view, the light-emitting element 20 is disposed at a position through which a virtual line (hereinafter, referred to as a second virtual line) passing through the midpoint of the short side of the submount 30 and parallel to the long side direction of the submount 30 passes.

After the one or more light-emitting elements 20 are disposed on the mounting surface of the first base 91, the wiring line 50 that electrically connects the light-emitting element 20 and the wiring pattern 104 is bonded. The wiring line 50 is bonded to the upper surface of the light-emitting element 20 and the wiring pattern 104. A first electrode of the light-emitting element 20 is electrically connected to one wiring pattern 104 provided on the lower surface of the first base 91 through the wiring line 50 and the first via wiring line 105, and a second electrode of the light-emitting element 20 is electrically connected to the other wiring pattern 104 provided on the lower surface of the first base 91 through the submount 30 and the second via wiring line 106.

Figure 5B:
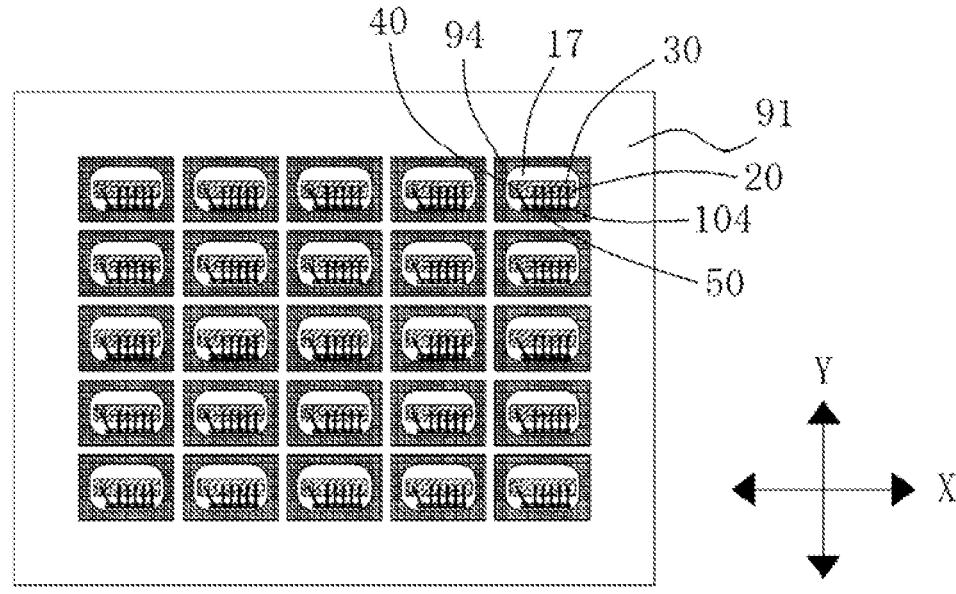
FIG. 5B is a view for illustrating another step in the manufacturing method of the light-emitting device according to each embodiment.

In the subsequent sixth step, the one or more protective elements 40 are disposed on the mounting surface of the first base 91. FIG. 5B illustrates a state in which the sixth step has been completed. The one or more protective elements 40 are bonded to the submount 30. The protective element 40 is disposed on the mounting surface of the first base 91 via the submount 30.

In the second plan view, the protective element 40 is disposed between a straight line passing along a lateral surface of the light-emitting element 20 opposite to the light-emitting surface 21 and a straight line passing along a short side of the mounting region facing the lateral surface. In the second plan view, the protective element 40 is disposed at a position through which the first virtual line passes. In the second plan view, the protective element 40 is disposed at a position through which the second virtual line passes.

After the protective element 40 is disposed on the mounting surface of the first base 91, the wiring line 50 that electrically connects the protective element 40 and the wiring pattern 104 is bonded. The wiring line 50 is bonded to the upper surface of the protective element 40 and the wiring pattern 104. A first electrode of the protective element 40 is electrically connected to one wiring pattern 104 provided on the lower surface of the first base 91 through the wiring line 50 and the first via wiring line 105, and a second electrode of the protective element 40 is electrically connected to the other wiring pattern 104 provided on the lower surface of the first base 91 through the submount 30 and the second via wiring line 106.

In the second plan view, when the mounting region is divided into two regions by a virtual line that passes through the midpoint of each of the long sides of the mounting region and is parallel to the short side of the mounting region, the light-emitting surface 21 of the light-emitting element 20 is included in one of the two regions, and the lateral surface of the light-emitting element 20 opposite to the light-emitting surface 21 and the protective element 40 are included in the other of the two regions.

In the subsequent third step, the second base 92A containing a wavelength conversion material is provided. The second base 92A with the one or more through holes penetrating from the upper surface to the lower surface of the second base 92A is provided. After the second base 92A having a planar shape is provided, the seventh step of forming, in the second base 92A, the one or more through holes penetrating from the upper surface to the lower surface of the second base 92A is performed. Alternatively, the second base 92A in which the one or more through holes have been formed may be obtained.

Figure 5C:
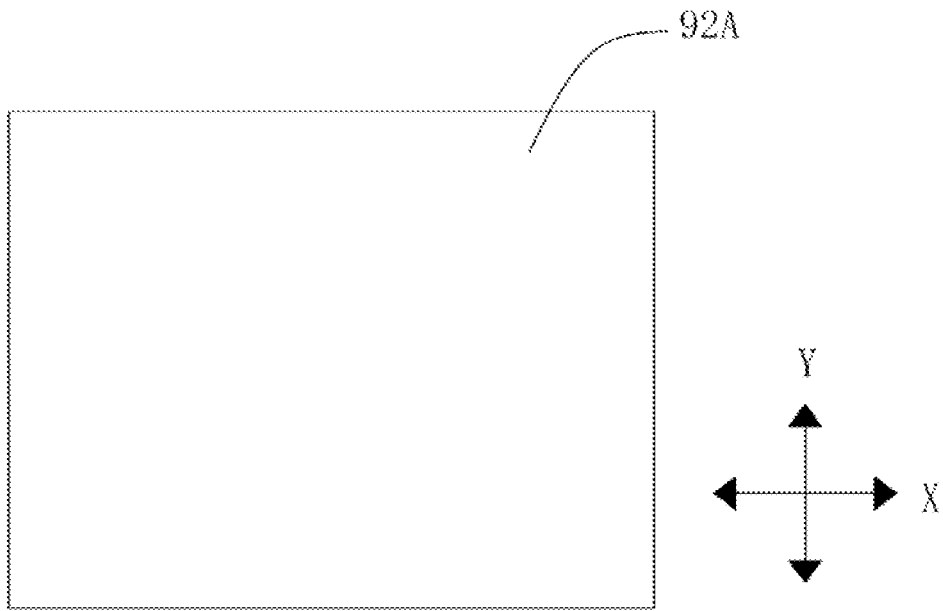
FIG. 5C is a view for illustrating one step in the manufacturing method of a second base according to the first embodiment.
Figure 5D:
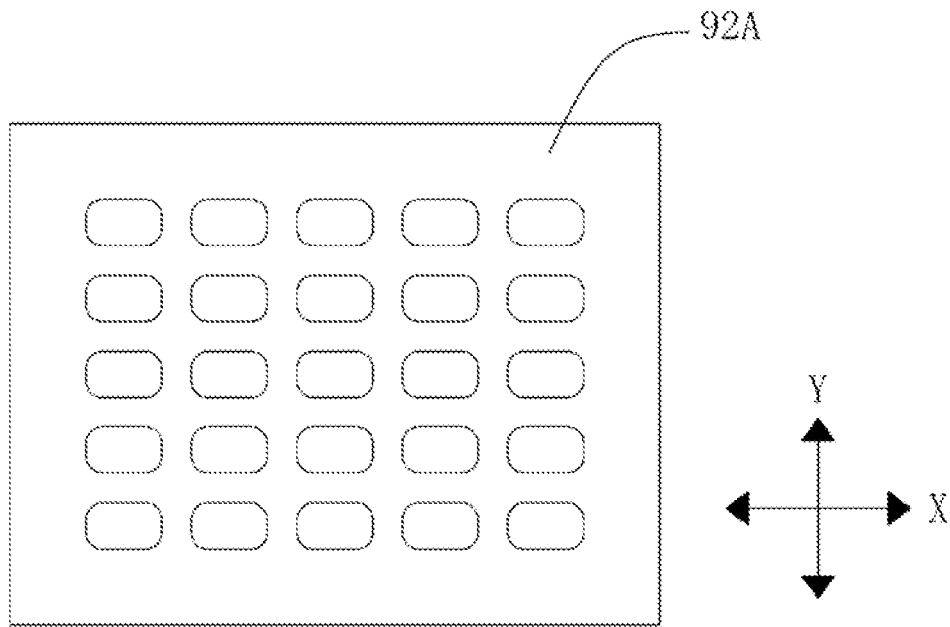
FIG. 5D is a view for illustrating another step in the manufacturing method of the second base according to the first embodiment.
Figure 5E:
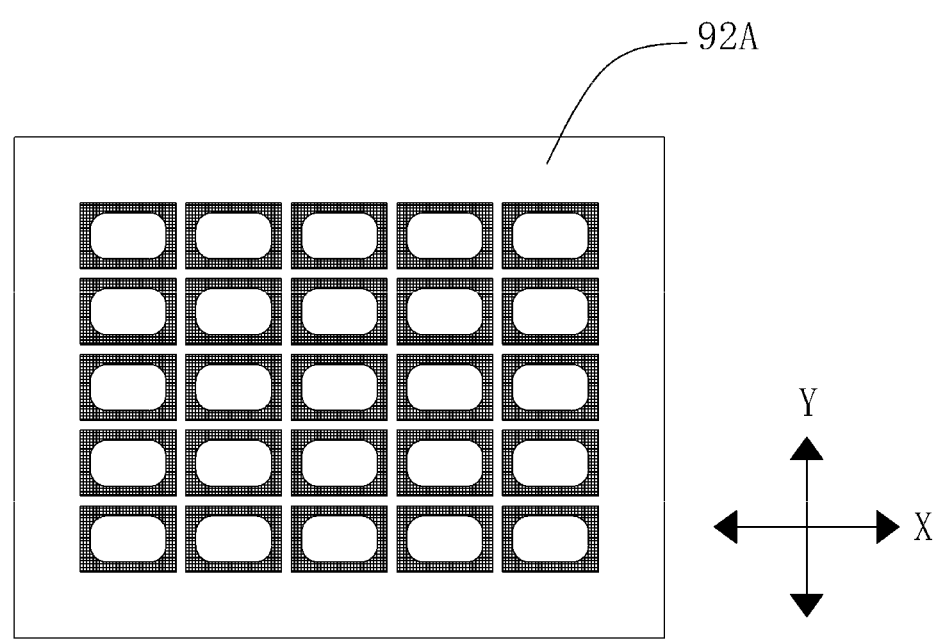
FIG. 5E is a view for illustrating another step in the manufacturing method of the second base according to the first embodiment.

For example, the second base 92A having a planar shape (a plate shape) as illustrated in FIG. 5C is provided, and the one or more through holes penetrating from the upper surface to the lower surface of the second base 92A are formed in the second base 92A. FIG. 5D illustrates a state in which the plurality of through holes are formed. Alternatively, as illustrated in FIG. 5E, a bonding pattern may be provided on the upper surface of the second base 92A.

The second base 92A includes a part to be the frame portion 15A of the light-emitting device 1. The inner lateral surface defining the through hole is the inner lateral surface 102 of the frame portion 15A. The second base 92A corresponds to the frame member 12A of the light-emitting device 1. The second base 92A can be formed of the material constituting the frame member 12A described above.

The second base 92A containing the wavelength conversion material can be, for example, a ceramic sintered compact in which a phosphor and a light-transmissive material such as aluminum oxide are sintered. The content of the phosphor can be in a range from 0.05 vol % to 50 vol % with respect to the total volume of the ceramic. Alternatively, for example, a ceramic made by sintering a powder of the phosphor, that is, a ceramic substantially consisting of only the phosphor may be used for the second base 92A.

In the second base 92A, the entire inner lateral surface in which the through hole is formed serves as a light transmission surface through which light is transmitted. The wavelength conversion material is contained in the entire second base 92A.

Figure 5F:
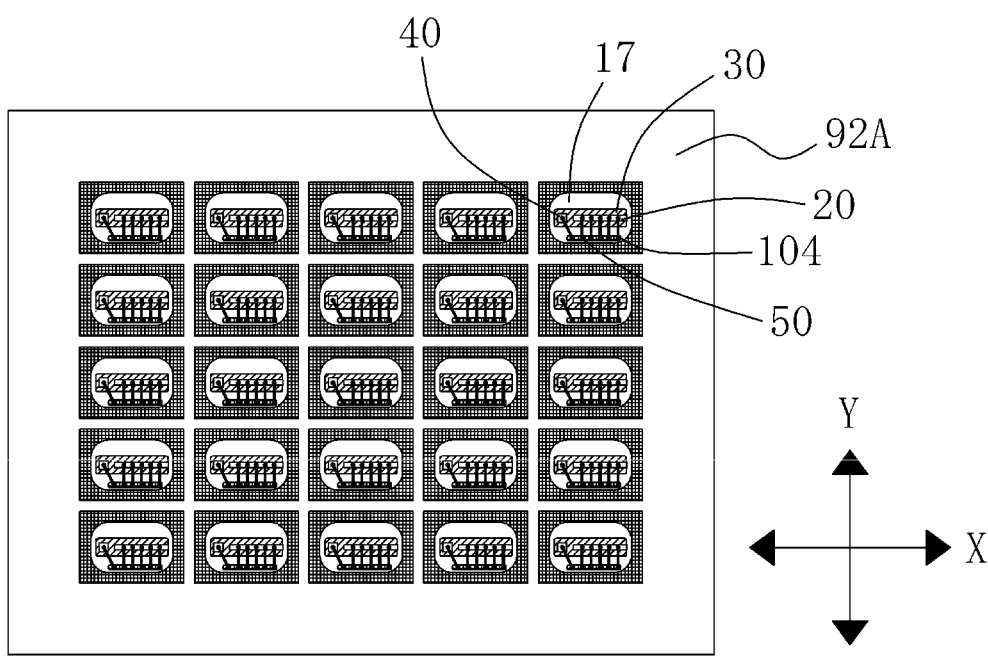
FIG. 5F is a view for illustrating another step in the manufacturing method of the light-emitting device according to the first embodiment.

In the subsequent fourth step, the second base 92A is bonded to the first base 91. FIG. 5F illustrates a state in which the fourth step has been completed. The second base 92A is bonded to the first base 91 such that each of the light-emitting elements 20 is accommodated in the corresponding one of the one or more through holes. The second base 92A is disposed on the first base 91 such that the through hole of the second base 92A surrounds the mounting region of the first base 91 in a top view. The second base 92A is disposed on the first base 91 such that the inner lateral surface defining a through hole and serving as the inner lateral surface 102 of the first part 18 of the frame portion 15A faces the light-emitting surface 21 of the light-emitting element 20 surrounded by the through hole.

Figure 5G:
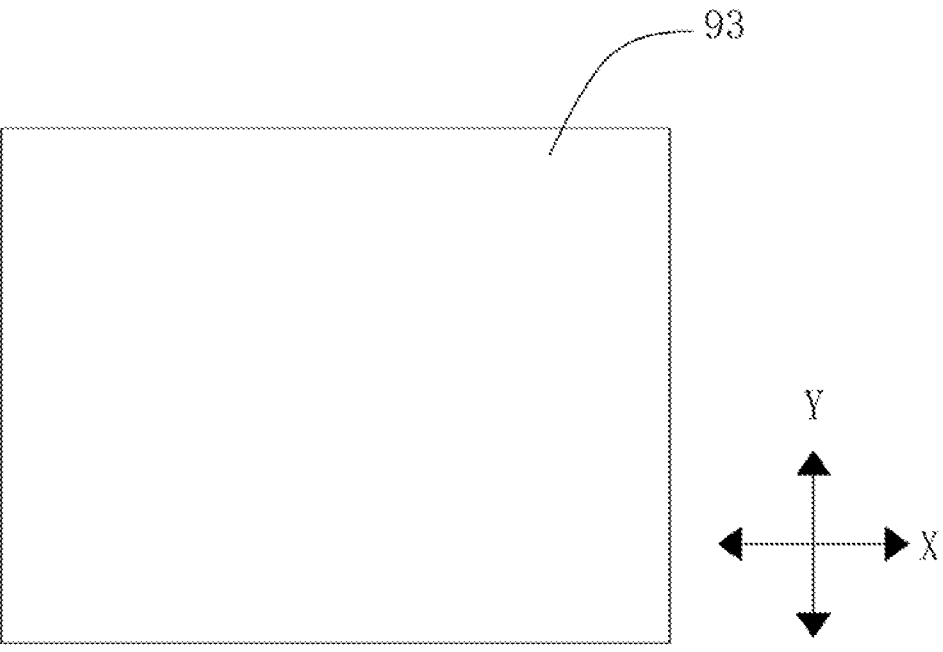
FIG. 5G is a view for illustrating another step in the manufacturing method of the light-emitting device according to each embodiment.

In the subsequent eighth step, the third base 93 is bonded to the second base 92A. FIG. 5G illustrates a state in which the eighth step has been completed. The third base 93 is bonded to the second base 92A opposite to the first base 91 so as to cover the one or more through holes of the second base 92A. Thus, a space in which the light-emitting element 20 is disposed is sealed. The third base 93 includes a part to be the cover portion 16 of the light-emitting device 1. The third base 93 can be formed of the material constituting the cover member 13 described above.

Figure 5H:
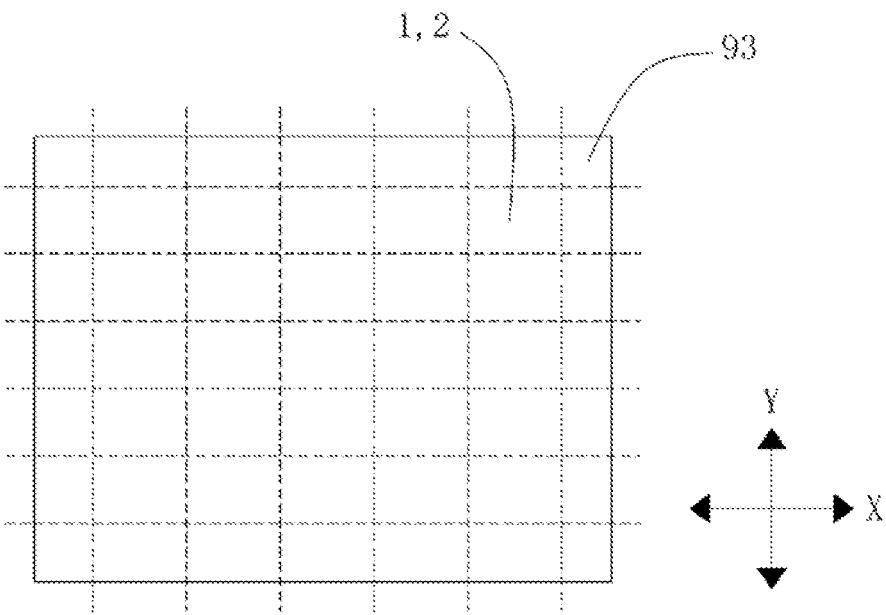
FIG. 5H is a view for illustrating another step in the manufacturing method of the light-emitting device according to each embodiment.

In the subsequent ninth step, the second base 92A and the first base 91 bonded to the second base 92A are cut to form the outer shape of the light-emitting device 1. Furthermore, the outer shape of the light-emitting device 1 can be formed by also including and cutting the third base 93 bonded to the second base 92A. In FIG. 5H, the cutting line is illustrated by broken lines. In the case in which a plurality of mounting regions are provided, cutting is performed so that the mounting regions are spaced apart from each other, whereby the plurality of light-emitting devices 1 are singulated. In this case, as illustrated in FIG. 5H, the ninth step can be said to be a step of singulating the plurality of light-emitting devices 1.

In this manner, the light-emitting device can be manufactured. The light-emitting device 1 may not include the cover member 13. For example, if a recessed portion is formed in the second base 92A instead of the through hole, the light-emitting element 20 can be sealed without the cover member 13. In a case in which the light-emitting device 1 is completed without sealing the light-emitting element 20, the cover member 13 is not used. Instead of covering with the cover member 13, the through hole may be filled with a resin or the like to seal the light-emitting element 20.

In the light-emitting device 1, the frame member 12A is fixed to the base member 11. The cover member 13 is fixed to the frame member 12A. The light-emitting element 20 is disposed in a space surrounded by the base member 11, the frame member 12A, and the cover member 13. This space is sealed, preferably hermetically sealed, under a predetermined atmosphere.

The light-emitting element 20 is disposed on the mounting surface 17 of the base portion 14. Light emitted from the light-emitting surface 21 of the light-emitting element 20 is incident on the inner lateral surface 102 of the first part 18 of the frame portion 15A. The light-emitting element 20 is a semiconductor laser element, and a fast axis direction of the FFP is a direction perpendicular to the mounting surface 17. Of the inner lateral surface 102 of the first part 18, the central flat region excluding the curved regions at the ends can be irradiated with the main part of the light.

A slow axis direction of the FFP may be a direction perpendicular to the mounting surface 17. When the inner lateral surface 102 of the first part 18 has a shape in which the direction parallel to the mounting surface 17 is longer than the direction perpendicular to the mounting surface 17, a proportion of a region irradiated with the light on the inner lateral surface 102 of the first part 18 can be increased by setting the fast axis direction of the FFP to be parallel to the mounting surface 17.

Preferably, a thickness of the submount 30 is set to a range from 200 μm to 500 μm. By setting the thickness of the submount 30 to 200 μm or more, the main part of light emitted from the light-emitting element 20 can be incident on the inner lateral surface 102 of the frame portion 15A without the light striking the mounting surface 17. By setting the thickness of the submount 30 to 500 μm or less, the light-emitting device 1 can be manufactured in a small size.

At least a part of the light incident on the inner lateral surface of the first part 18 is wavelength-converted by the wavelength conversion material contained in the frame portion 15A. The light wavelength-converted in the frame portion 15A is emitted from the outer lateral surface 103 of the first part 18. Part of the light emitted from the light-emitting element 20 can also be emitted from the outer lateral surface 103 of the first part 18. For example, the light-emitting element 20 that emits blue light and a wavelength conversion material that wavelength-converts blue light into yellow light may be combined to emit white light that travels laterally from the frame portion 15A.

Second Embodiment

Figure 6:
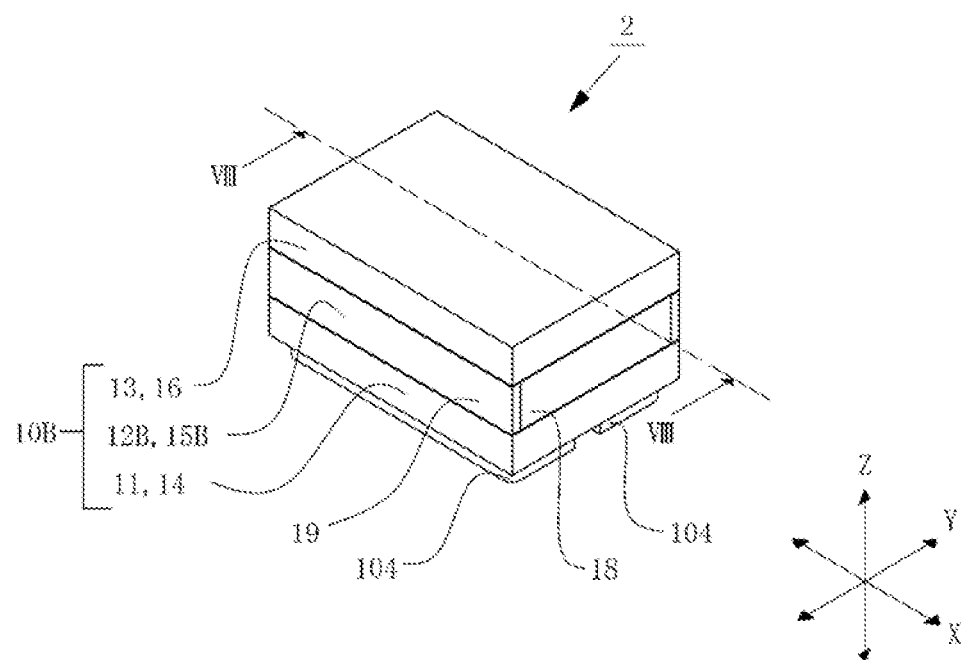
FIG. 6 is a perspective view of a light-emitting device according to a second embodiment.
Figure 7:
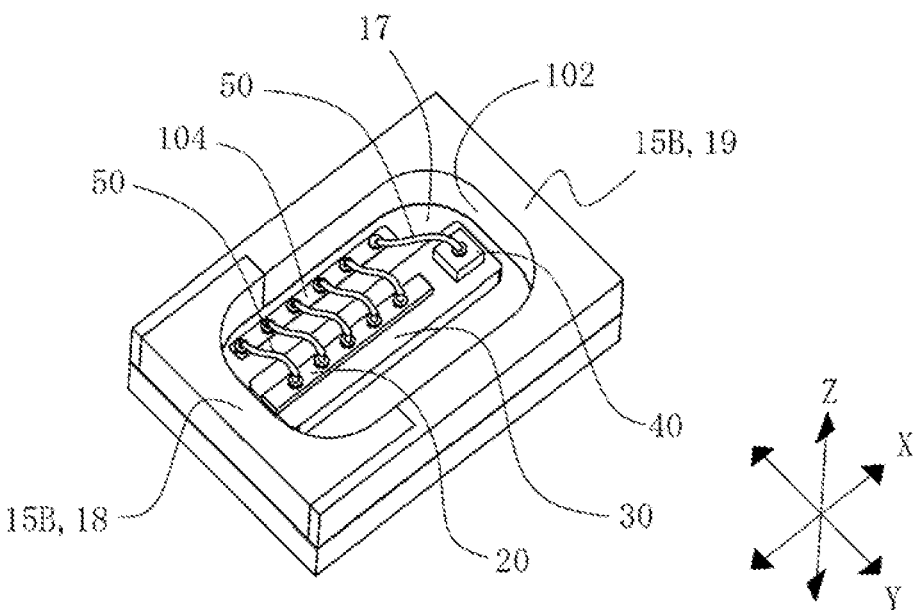
FIG. 7 is a perspective view of a state in which a cover member is removed from the light-emitting device for illustrating an internal configuration of a package of the light-emitting device according to the second embodiment.
Figure 8:
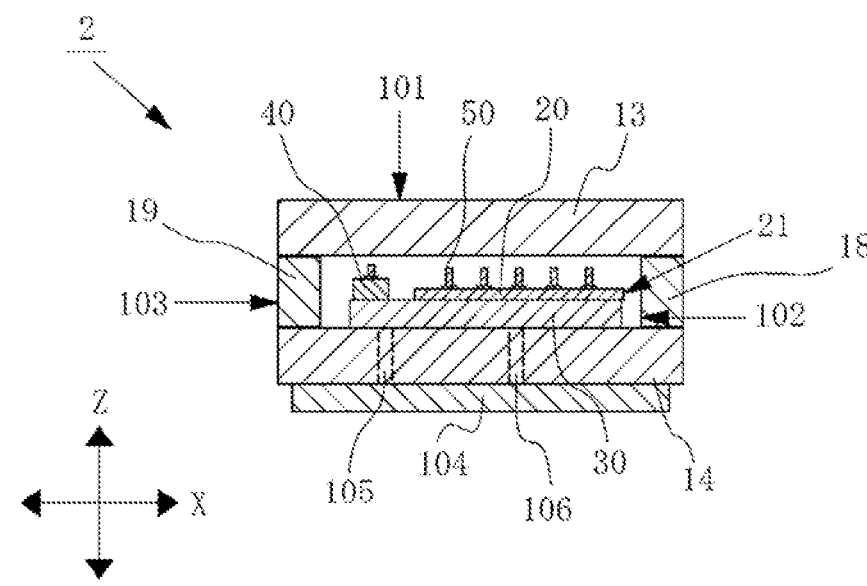
FIG. 8 is a cross-sectional view taken along a section line VIII-VIII in FIG. 6.

A light-emitting device 2 according to the second embodiment will now be described. FIGS. 6 to 8 and 9A to 9E are views for illustrating an exemplary embodiment of the light-emitting device 2. FIG. 6 is a perspective view of the light-emitting device 2. FIG. 7 is a perspective view of the light-emitting device 2 from which the cover member 13 is removed for illustrating an internal configuration of a package 10B. FIG. 8 is a cross-sectional view taken along a section line VIII-VIII in FIG. 6. In the cross-sectional view of FIG. 8, positions of the first via wiring line 105 and the second via wiring line 106 that do not appear on the cross-section are indicated by broken lines. FIGS. 4, 5A, 5B, 5G, and 5H are also drawings for illustrating the light-emitting device 2.

The light-emitting device 2 includes a plurality of components. The plurality of components include the package 10B, the one or more light-emitting elements 20, the one or more submounts 30, the one or more protective elements 40, and the plurality of wiring lines 50. Furthermore, the package 10B includes a plurality of components including the base member 11, a frame member 12B, and the cover member 13.

In the description of the light-emitting device 1 and the components according to the first embodiment, all the contents except for inconsistent contents in FIGS. 6 to 8, 4, 5A, 5B, 9A to 9E, 5G, and 5H according to the light-emitting device 2 also apply to the description of the light-emitting device 2. All contents not inconsistent will not be described again in order to avoid duplication. The description of the package 10A, the frame member 12A, the frame portion 15A, and the second base 92A in the first embodiment also applies to the description of the package 10B, the frame member 12B, a frame portion 15B, and a second base 92B in the second embodiment, except for inconsistent contents in these drawings.

Package 10B

The package 10B includes the frame portion 15B. The frame portion 15B contains the wavelength conversion material in the first part 18 and does not contain the wavelength conversion material in the second part 19. The frame portion 15B transmits visible light in the first part 18 and blocks visible light in the second part 19. Here, the transmission means that the transmittance is 70% or more, and the blocking means that the transmittance is 50% or less.

In the first plan view, when the frame portion 15B is divided into two parts by a virtual line that passes through the midpoint of a length of the inner edge of the frame portion 15B in the X direction and is parallel to the Y direction, the first part 18 of the frame portion 15B is included in one of the two parts and not included in the other of the two parts.

In the first plan view, a length of the first part 18 of the frame portion 15B in the Y direction is less than a length of the outer edge of the frame portion 15B in the Y direction. In the first plan view, the length of the first part 18 of the frame portion 15B in the Y direction is greater than a length of the inner edge of the frame portion 15B in the Y direction.

In the first plan view, the entire length of the inner edge of the first part 18 of the frame portion 15B is in a range from 80% to 200% of a length of a short side of the inner edge of the frame portion 15B. With this configuration, the light wavelength-converted by the wavelength conversion material can be efficiently emitted from one outer lateral surface 103. The inner edge of the first part 18 includes at least a part of the region in which the corner of the inner edge of the frame portion 15B is rounded.

The first part 18 of the frame portion 15B is exposed at a part of the one outer lateral surface 103 extending in the short side direction of the frame portion 15B and is not exposed at other outer lateral surfaces 103. The second part 19 of the frame portion 15B is exposed at the other part of the one outer lateral surface 103 and other outer lateral surfaces 103. In the first plan view, the outer edge of the first part 18 of the frame portion 15B is surrounded by the second part 19 of the frame portion 15B except for a portion exposed at the one outer lateral surface 103 of the frame portion 15B. Thus, a region of the one outer lateral surface 103 where the first part 18 is exposed can be used as a light-emitting surface.

The first part 18 of the frame member 12B can be formed by using ceramic as a main material. Examples of the ceramic include aluminum nitride, silicon nitride, aluminum oxide, and silicon carbide. In addition, it is preferable to form the first part 18 by using aluminum nitride having good heat dissipation properties.

A material other than ceramic may be used as a main material of the first part 18. For example, the first part 18 may be formed by using glass as a main material. Furthermore, for example, the first part 18 may be formed of a glass containing a phosphor as a main material. Examples of the glass include quartz glass and the like. Alternatively, for example, the first part 18 may be formed of a single crystal of a phosphor.

The second part 19 of the frame member 12B can be formed by using ceramic as a main material. Examples of the ceramic include aluminum nitride, silicon nitride, aluminum oxide, and silicon carbide.

Light-Emitting Device 2

Subsequently, a manufacturing method of the light-emitting device 2 including the above-described components will be described.

In the manufacturing method of the light-emitting device 1, the second base 92A including the part to be the frame portion 15A is provided in the third step, whereas in the manufacturing method of the light-emitting device 2, the second base 92B including the part to be the frame portion 15B is provided in the third step. Then, in the fourth step, the second base 92B is bonded to the first base 91.

FIGS. 9A to 9D are views for illustrating a manufacturing method of a second base 92B including the part to be the frame portion 15B. The second base 92B can be manufactured by a manufacturing method including providing one or more first members 92B1 containing a wavelength conversion material (hereinafter referred to as a tenth step), forming a second base 92B by providing a second member 92B2 surrounding the outer periphery of the one or more first members 92B1 in top view (hereinafter referred to as an eleventh step), and forming, in the second base 92B, one or more through holes penetrating from the upper surface to the lower surface of the second base 92B (hereinafter referred to as a twelfth step). The manufacturing method of the second base 92B may include providing a bonding pattern 92B3 on the upper surface of the second base 92B (hereinafter, referred to as a thirteenth step).

Figure 9A:
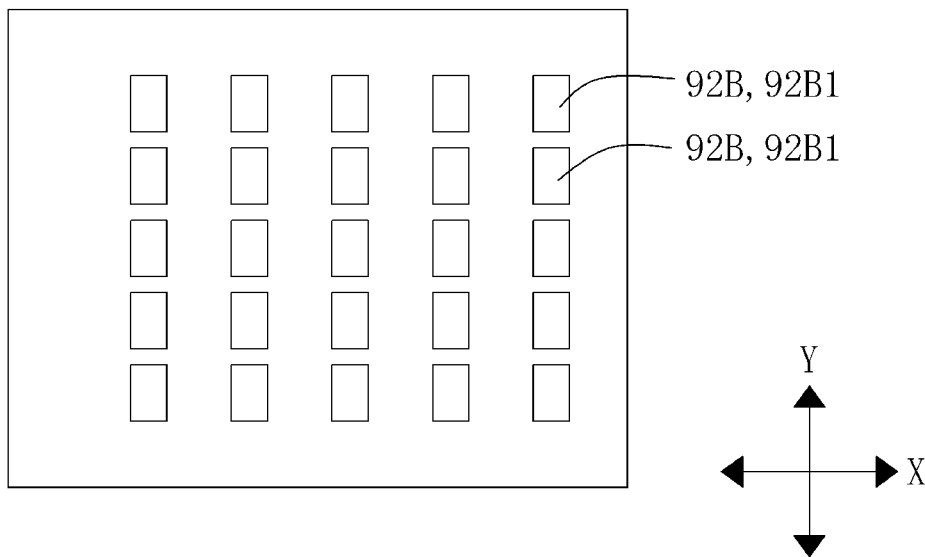
FIG. 9A is a view for illustrating one step in the manufacturing method of a second base according to the second embodiment.

In the tenth step, the one or more first members 92B1 made of a material constituting the first part 18 of the frame portion 15B are provided. The one or more first members 92B1 are disposed on the main surface of the device for manufacturing the second base 92B. In FIG. 9A, the plurality of first members 92B1 are disposed so as to be spaced apart from each other.

The first member 92B1 has a quadrangular outer shape having short sides and long sides in a top view. The shape of the first member 92B1 can be a rectangular parallelepiped. In FIG. 9A, each of the plurality of first members 92B1 has a rectangular outer shape in a top view.

Figure 9B:
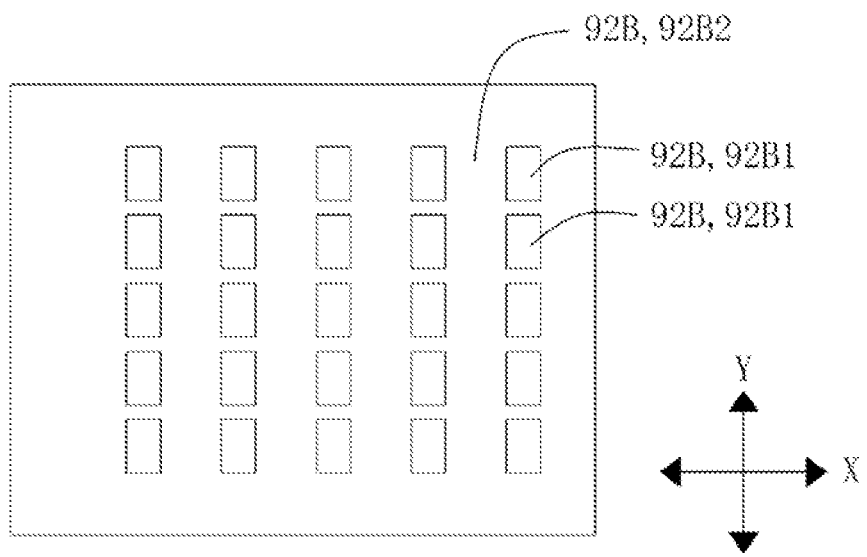
FIG. 9B is a view for illustrating another step in the manufacturing method of the second base according to the second embodiment.

In the subsequent eleventh step, the second member 92B2 is provided surrounding the outer periphery of the one or more first members 92B1. Alternatively, the second base 92B in which the first member 92B1 and the second member 92B2 are integrally formed is prepared. The second member 92B2 is made of a material constituting the second part 19 of the frame portion 15B. In FIG. 9B, the second member is provided to fill gaps between the plurality of first members 92B1, and the second base 92B including the plurality of first members 92B1 is formed.

Such a second base 92B can be formed by, for example, disposing the material of the second member 92B2 surrounding the outer periphery of the first member 92B1 and integrally sintering the material. The second base 92B may be a ceramic sintered compact obtained by sintering the first member 92B1 whose main material is ceramic and the second member 92B2 whose main material is ceramic.

Figure 9C:
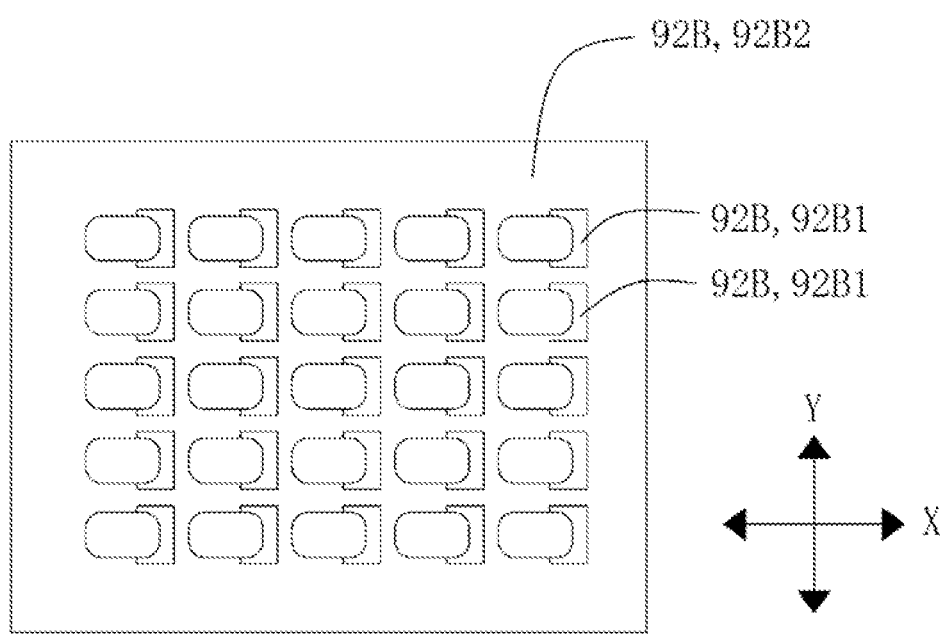
FIG. 9C is a view for illustrating another step in the manufacturing method of the second base according to the second embodiment.

In the subsequent twelfth step, the one or more through holes penetrating from the upper surface to the lower surface of the second base 92B are formed in the second base 92B. The through hole is formed so that the first member 92B1 is partially removed. In FIG. 9C, regarding each of the plurality of through holes, the through hole is formed such that one of the two long sides of the first member 92B1 is partially removed and the other long side and the two short sides are not removed in a top view.

In the subsequent thirteenth step, one or more bonding patterns 92B3 are provided on the upper surface of the second base 92B. The bonding pattern 92B3 surrounds the through hole formed in the second base 92B in a top view. One bonding pattern 92B3 is provided for one through hole.

The bonding pattern 92B3 does not cover the entire first member 92B1 in contact with the through hole in a top view. In a top view, a length of the bonding pattern 92B3 in the Y direction is greater than a length of the first member 92B1 in the Y direction.

Figure 9D:
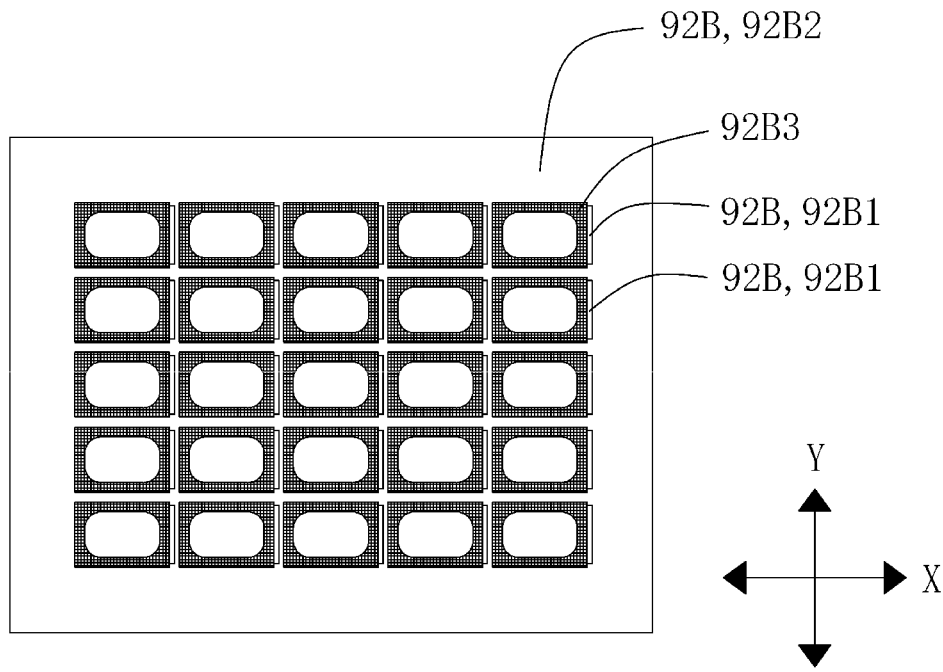
FIG. 9D is a view for illustrating another step in the manufacturing method of the second base according to the second embodiment.

In FIG. 9D, the long side of the first member 92B1, which is not removed by the through hole, is not covered by the bonding pattern 92B3 in a top view. In a top view, the long side of the first member 92B1 partially removed by the through hole is entirely covered by the bonding pattern 92B3. In a top view, each of the two short sides of the first member 92B1 is partially covered by the bonding pattern 92B3.

17

Figure 9E:
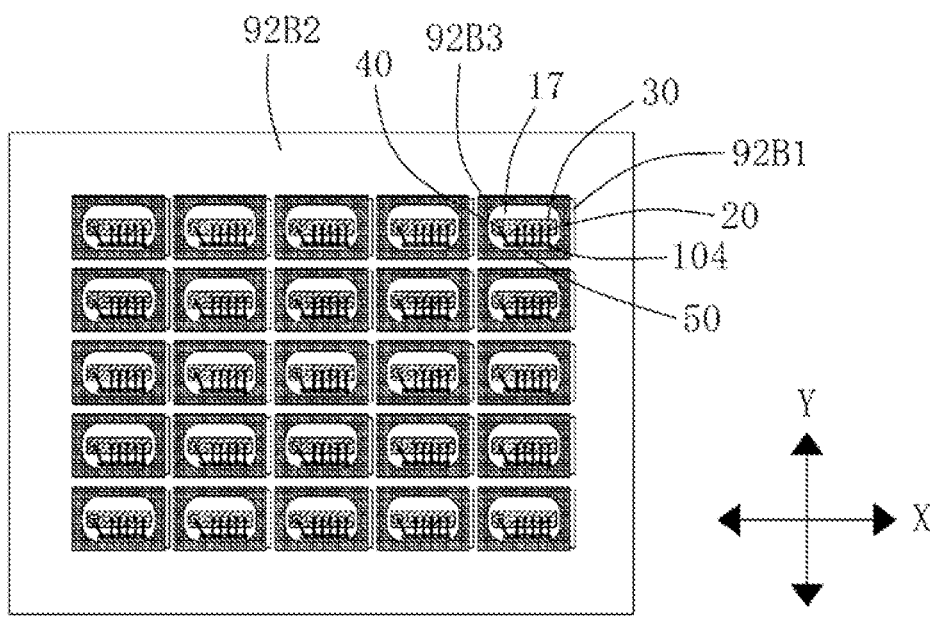
FIG. 9E is a view for illustrating another step in the manufacturing method of the light-emitting device according to the second embodiment.

The second base 92B provided in this manner is bonded to the first base 91. That is, the same step as the fourth step described in the first embodiment is performed. The subsequent steps are the same as those in the first embodiment. FIG. 9E illustrates a state in which the fourth step has been completed.

In the ninth step, the second base 92B and the first base 91 bonded to the second base 92B are cut to form the outer shape of the light-emitting device 2. At this time, the second base 92B is cut so that at least a part of the one or more outer lateral surfaces 103 of the light-emitting device 2 is formed by the first member 92B1. Because the first member 92B1 is not entirely covered by the bonding pattern 92B3, such cutting is easily performed.

In the light-emitting device 2, the first part 18 transmits light emitted from the light-emitting element 20. The second part 19 blocks the light emitted from the light-emitting element 20. In addition, the second part 19 blocks light wavelength-converted by the wavelength conversion material of the first part 18.

In the first plan view, the light-emitting surface 21 of the light-emitting element 20 is provided in a region surrounded by an inner edge of the first part 18 and a virtual plane that passes through a connection point at which the first part 18 and the second part 19 are connected with each other on the one or more inner lateral surfaces 102 and is parallel to the light-emitting surface 21. By forming the inner lateral surface of the first part 18 by using the through hole in this manner, the thickness of the first part 18 in the traveling direction of the light emitted from the light-emitting element 20 can be reduced, which can contribute to the reduction in size of the light-emitting device 1.

A length of the first part 18 of the frame portion 15B in the X direction is less than a length of the wiring pattern 104 in the X direction provided on the mounting surface 17. The length of the first part 18 of the frame portion 15B in the X direction is less than a length the light-emitting elements 20 in the X direction disposed on the mounting surface 17. When the light-emitting device 1 is designed to be small, such a relationship may be satisfied.

Although each of the embodiments according to the present invention has been described above, the light-emitting device according to the present invention is not strictly limited to the light-emitting device in each of the embodiments. In other words, the present invention can be achieved without being limited to the external shape or structure of the light-emitting device disclosed by each of the embodiments. The present invention can be applied without requiring all the components being sufficiently provided. For example, in a case in which some of the components of the light-emitting device disclosed by the embodiments are not stated in the scope of the claims, the degree of freedom in design by those skilled in the art such as substitutions, omissions, shape modifications, and material changes for those components is allowed, and then the invention stated in the scope of the claims being applied to those components is specified.

The light-emitting device according to each embodiment can be used for an in-vehicle headlight, a head-mounted display, lighting, a projector, a display, and the like.

What is claimed is:
1. A light-emitting device comprising:
a base member having a mounting surface;
a frame member fixed to the base member and having one or more inner lateral surfaces and one or more outer lateral surfaces, the frame member including

18 a first part containing a wavelength conversion material and defining one part of the one or more inner lateral surfaces and one part of the one or more outer lateral surfaces, and
a second part connected with the first part and defining another part of the one or more inner lateral surfaces and another part of the one or more outer lateral surfaces,
the first part and the second part being integrally sintered together to form a sintered compact; and
a light-emitting element disposed on the mounting surface, the light-emitting element having a light-emitting surface, and configured to emit, from the light-emitting surface, light to be incident on the one part of the one or more inner lateral surfaces defined by the first part of the frame member.

2. The light-emitting device according to claim 1, wherein the second part contains the wavelength conversion material.

3. The light-emitting device according to claim 1, wherein the first part is configured to transmit the light emitted from the light-emitting element, and
the second part is configured to block the light emitted from the light-emitting element.

4. A light-emitting device comprising:
a base member having a mounting surface:
a frame member fixed to the base member and having one or more inner lateral surfaces and one or more outer lateral surfaces, the frame member including
a first part containing a wavelength conversion material and defining one part of the one or more inner lateral surfaces and one part of the one or more outer lateral surfaces, and
a second part connected with the first part and defining another part of the one or more inner lateral surfaces and another part of the one or more outer lateral surfaces; and
a light-emitting element disposed on the mounting surface, the light-emitting element having a light-emitting surface, and configured to emit, from the light-emitting surface, light to be incident on the one part of the one or more inner lateral surfaces defined by the first part of the frame member, wherein
the first part is configured to transmit the light emitted from the light-emitting element,
the second part is configured to block the light emitted from the light-emitting element,
in a plan view as seen along a normal direction perpendicular to the mounting surface, the light-emitting surface is provided in a region surrounded by a virtual plane and an inner edge of the first part, and
the virtual plane passes through a connection point where the first part and the second part are connected with each other on the one or more inner lateral surfaces and is parallel to the light-emitting surface.

5. The light-emitting device according to claim 1, wherein the second part is made of ceramic.

6. The light-emitting device according to claim 5, wherein the first part is made of ceramic.

7. The light-emitting device according to claim 1, further comprising:
a cover member fixed to the frame member, wherein
The base member, the frame member and the cover member define a sealed space where the light-emitting element is disposed.

8. The light-emitting device according to claim 7, wherein the base member is made of ceramic, the first part and the second part of the frame member are made of ceramic, and the cover member is made of ceramic.

9. The light-emitting device according to claim 1, wherein the light-emitting element is a semiconductor laser element.

* * * * *